United States Patent
Lee

(10) Patent No.: US 10,298,224 B2
(45) Date of Patent: May 21, 2019

(54) ISOLATED GATE DRIVER AND A POWER DEVICE DRIVING SYSTEM INCLUDING THE SAME

(71) Applicant: HYUNDAI AUTRON CO., LTD., Seongnam-si (KR)

(72) Inventor: Soon Seob Lee, Seoul (KR)

(73) Assignee: HYUNDAI AUTRON CO., LTD., Seongnam-si (KR)

(*) Notice: Subject to any disclaimer, the term of this patent is extended or adjusted under 35 U.S.C. 154(b) by 156 days.

(21) Appl. No.: 15/659,363

(22) Filed: Jul. 25, 2017

(65) Prior Publication Data
US 2018/0034456 A1 Feb. 1, 2018

(30) Foreign Application Priority Data

Jul. 27, 2016 (KR) .......................... 10-2016-0095550

(51) Int. Cl.
| | |
|---|---|
| H03K 17/082 | (2006.01) |
| H01L 23/64 | (2006.01) |
| H02M 1/088 | (2006.01) |
| H03K 17/18 | (2006.01) |
| H03K 17/567 | (2006.01) |
| H02M 1/08 | (2006.01) |

(Continued)

(52) U.S. Cl.
CPC ......... *H03K 17/0828* (2013.01); *H01L 23/64* (2013.01); *H02M 1/08* (2013.01); *H02M 1/088* (2013.01); *H03K 17/163* (2013.01); *H03K 17/18* (2013.01); *H03K 17/567* (2013.01); *H02M 2001/0029* (2013.01)

(58) Field of Classification Search
CPC .. B60L 15/20; H03K 17/0828; H03K 17/163; H03K 17/567; H03K 17/18; H01L 23/64; H02M 1/08; H02M 1/088; H02M 2001/0029
See application file for complete search history.

(56) References Cited

U.S. PATENT DOCUMENTS

2018/0034459 A1* 2/2018 Lee ........................ B60L 15/20

* cited by examiner

*Primary Examiner* — Robert L Deberadinis
(74) *Attorney, Agent, or Firm* — Morgan, Lewis & Bockius LLP

(57) ABSTRACT

According to the present invention, there is provided an isolated gate driver comprising: a low voltage part including a PWM transmission unit for receiving a PWM signal from a microcontroller unit and outputting a low voltage PWM signal, and a low voltage logic block for receiving a control signal from the microcontroller unit and outputting a low voltage control signal; an insulation part for boosting the low voltage PWM signal and the low voltage control signal into a high voltage PWM signal and a high voltage control signal, respectively; and a high voltage part insulated from the low voltage part by the insulation part, wherein the high voltage part including: a high voltage logic block for outputting a slew rate control signal in accordance with the high voltage control signal; a slew rate controller for controlling a slew rate of a gate voltage of a power device external to the isolated gate driver such that the gate voltage of the power device has the slew rate depending on the slew rate control signal at a rising edge or a falling edge; and a slew rate feedback unit including a slew rate measuring unit for measuring the slew rate of the gate voltage and allowing the slew rate controller to change the slew rate of the gate voltage.

14 Claims, 6 Drawing Sheets

(51) Int. Cl.
*H03K 17/16* (2006.01)
*H02M 1/00* (2006.01)

ISOLATED GATE DRIVER AND A POWER DEVICE DRIVING SYSTEM INCLUDING THE SAME

CROSS-REFERENCE TO RELATED APPLICATIONS

This application claims priority to and the benefit of Korean Patent Application No. 10-2016-0095550 filed in the Korean Intellectual Property Office on Jul. 27, 2016, the entire contents of which are incorporated herein by reference.

BACKGROUND OF THE INVENTION

Field of the Invention

The present invention relates to a power device driving system, and more particularly, to a power device driving system including an isolated gate driver and an isolated gate driver for driving a power device for a vehicle.

Background Art

Recently, as the sales of eco-friendly vehicles grow, power devices such as IGBT (Insulated Gate Bipolar Transistor) or SiC (Silicon Carbide) have been increasingly used as switching devices for driving electric vehicles or hybrid vehicle systems that use a lot of high voltage signals like a motor driving or high voltage conversion.

Further, isolated gate drivers also have been increasingly used to drive such power devices. In the isolated gate drivers, the slope of the voltage applied to the gate (slew rate) should be properly adjusted for the safe operation of the power devices. Conventionally, when an isolated gate driver provided power to the gate of power devices, a slew rate of the gate voltage was controlled by external resistors which had fixed resistance values in a circuit design.

FIG. 1 is a circuit diagram illustrating an isolated gate driver according to the prior art. Referring to FIG. 1, the conventional slew rate controller of an input voltage will be described below. The isolated gate driver of FIG. 1 includes a low voltage part 110 driven by a low voltage power supply LVDD, a high voltage part 120 driven by a high voltage power supply HVDD, an insulation part 130 and an external slew rate control part 140.

As shown in FIG. 1, since the conventional isolated gate driver controlled the slew rate through the external resistors having fixed resistance values, there were a lot of limitations that the slew rates of the gate voltages of the power devices were fixed only to initial design values.

Prior Art Document: Korean Patent Registration No. 10-0212754 (Issued Date: May 12, 1999)

SUMMARY OF THE INVENTION

An object of the present invention is to provide an isolated gate driver which can accurately control slew rates during turn-on and turn-off of the power device for a vehicle based on the PWM signal and the control signal from the microcontroller unit. However, these problems are illustrative, and thus the scope of the present invention is not limited thereto.

According to an aspect of the present invention, there is provided an isolated gate driver comprising: a low voltage part including a PWM transmission unit for receiving a PWM signal from a microcontroller unit and outputting a low voltage PWM signal, and a low voltage logic block for receiving a control signal from the microcontroller unit and outputting a low voltage control signal; an insulation part for boosting the low voltage PWM signal and the low voltage control signal into a high voltage PWM signal and a high voltage control signal, respectively; and a high voltage part insulated from the low voltage part by the insulation part, wherein the high voltage part including: a high voltage logic block for outputting a slew rate control signal in accordance with the high voltage control signal; a slew rate controller for controlling a slew rate of a gate voltage of a power device external to the isolated gate driver such that the gate voltage of the power device has the slew rate depending on the slew rate control signal at a rising edge or a falling edge; and a slew rate feedback unit including a slew rate measuring unit for measuring the slew rate of the gate voltage and allowing the slew rate controller to change the slew rate of the gate voltage.

In this case, the slew rate feedback unit further includes a feedback signal generating unit for generating a slew rate change signal when the slew rate of the gate voltage measured by the slew rate measuring unit is out of a reference range and for outputting the slew rate change signal to the slew rate controller, and the slew rate controller changes the slew rate of the gate voltage based on the slew rate change signal.

Further, the slew rate feedback unit further includes a communication unit and outputs the slew rate value measured by the slew rate measuring unit to the high voltage logic block through the communication unit.

Further, the high voltage logic block is configured to control the slew rate controller to change the slew rate of the gate voltage based on the slew rate value Further, the slew rate feedback unit further includes a high voltage comparator and a low voltage comparator, the high voltage comparator generates a high voltage comparison signal based on a reference high voltage, and the low voltage comparator generates a low voltage comparison signal based on a reference low voltage and the slew rate measuring unit measures the slew rate of the gate voltage based on the high voltage comparison signal and the low voltage comparison signal.

Further, wherein the slew rate measuring unit includes a counter, wherein the counter starts counting when the high voltage comparison signal is generated at the falling edge and terminates the counting when the low voltage comparison signal is generated after the falling edge.

Further, the slew rate measuring unit includes a counter, wherein the counter starts counting when the low voltage comparison signal is generated at the rising edge and terminates the counting when the high voltage comparison signal is generated after the rising edge.

Further, the slew rate controller includes a plurality of buffers each having first and second switching units switched by the slew rate control signal and the high voltage PWM signal.

Further, the plurality of buffers includes at least a first buffer and a second buffer and a magnitude of current flowing in the first switching unit of the first buffer is different from a magnitude of current flowing in the first switch portion of the second buffer.

Meanwhile, according to an embodiment of the present invention, there is provided a power device drive system comprising: a microcontroller unit; a power device; and an isolated gate driver configured to receive a PWM signal and a control signal from the microcontroller unit and configured so that the PWM signal applied to the gate of the power device has a controlled slew rate, wherein the isolated gate driver comprises: a low voltage part including a PWM transmission unit for receiving the PWM signal from the microcontroller unit and outputting a low voltage PWM signal, and a low voltage logic block for receiving a control signal from the microcontroller unit and outputting a low voltage control signal; an insulation part for boosting the low voltage PWM signal and the low voltage control signal into a high voltage PWM signal and a high voltage control signal, respectively; and a high voltage part insulated from the low voltage part by the insulation part, wherein the high voltage part including: a high voltage logic block for outputting a slew rate control signal in accordance with the high voltage control signal; a slew rate controller for controlling a slew rate of a gate voltage of a power device external to the isolated gate driver such that the gate voltage of the power device has the slew rate depending on the slew rate control signal at a rising edge or a falling edge; and a slew rate feedback unit including a slew rate measuring unit for measuring the slew rate of the gate voltage and allowing the slew rate controller to change the slew rate of the gate voltage.

In this case, the slew rate feedback unit further includes a feedback signal generating unit for generating a slew rate change signal when the slew rate of the gate measured by the slew rate measuring unit is out of a reference range and for outputting the slew rate change signal to the slew rate controller, and the slew rate controller changes the slew rate of the gate based on the slew rate change signal.

Further, the slew rate feedback unit further includes a communication unit and outputs the slew rate value measured by the slew rate measuring unit to the high voltage logic block through the communication unit.

Further, the high voltage logic block is configured to control the slew rate controller to change the slew rate of the gate based on the slew rate value.

Further, the high voltage logic block sends the slew rate value to the microcontroller unit through the low voltage logic block, and wherein the microcontroller unit check whether the slew rate value is in a reference slew rate range and generates a control signal for controlling the slew rate controller.

Therefore, according to the present invention, the turn-on/off slope of the power device can be accurately controlled based on the PWM signal and the control signal from the microcontroller unit, and the controlled slope can be measured to change the slope to the correct slope. Accordingly, the slew rate during the turn-on/off can be precisely controlled. In addition, since the slope control of the gate driving voltage, which is conventionally performed by an external device such as a resistor connected to the outside, can be performed in the isolated gate driver, the cost can be reduced by incorporating a conventional external device. In addition, the gate voltage slope (slew rate) of the power device can be automatically selected optimally according to various situations (overcurrent, short circuit, etc.), and the active mirror clamp function can be built in. Therefore, the stability of a power device consuming a lot of power could be greatly improved, and the efficiency could be improved by optimized control, which can improve the fuel efficiency of the vehicle.

DESCRIPTION OF REFERENCE NUMERALS

Figure 1:
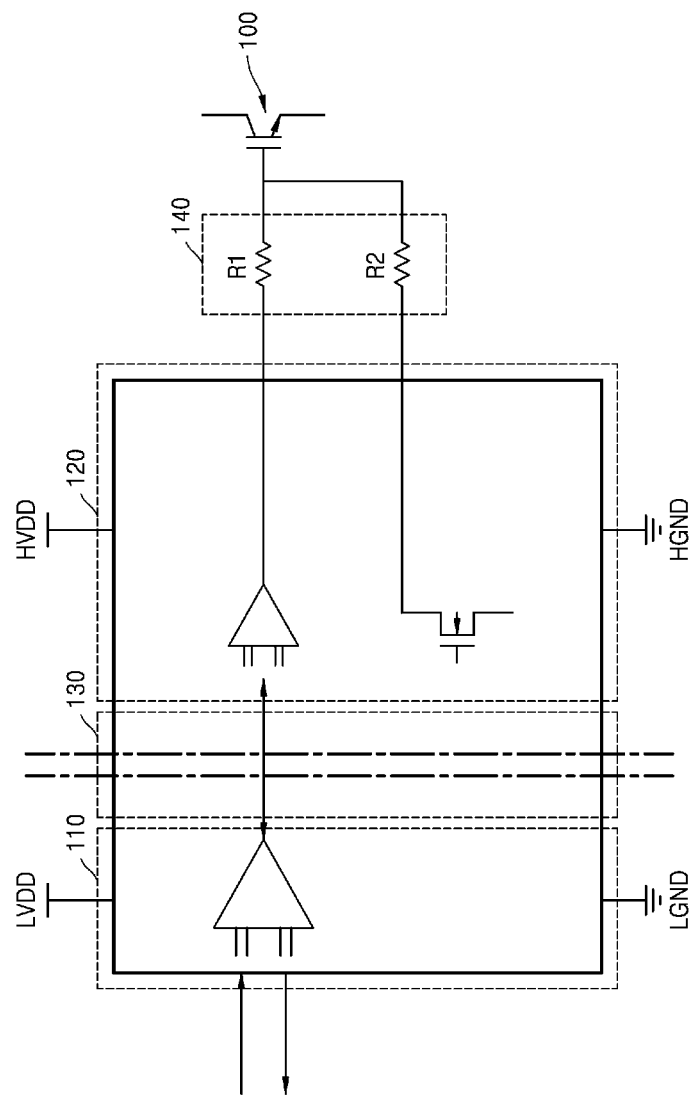
FIG. 1 is a circuit diagram illustrating a power device driving system according to the prior art.

210: Low Voltage Part
212: PWM transmission unit
214: Low Voltage Logic block
220: High Voltage Part
222: High Voltage Logic Block
224: Slew Rate Controller
242: Low Voltage Comparator
244: High Voltage Comparator
612: Counter

DETAILED DESCRIPTION OF THE INVENTION

Hereinafter, embodiments of the present invention will be described in detail with reference to the accompanying drawings. It should be understood, however, that the invention is not limited to the disclosed embodiments, but may be embodied in many different forms and should not be construed as being limited to the embodiments set forth herein. Rather, these embodiments are provided so that this disclosure will be thorough and complete, to be fully informed. Also, for purposes of explanation, components may be exaggerated or reduced in size in the drawings.

Hereinafter, preferred embodiments of the present invention will be described in detail with reference to the accompanying drawings. The following embodiments are to be considered as illustrative and not restrictive, and the scope of the present invention is not limited only by the following embodiments.

Figure 2:
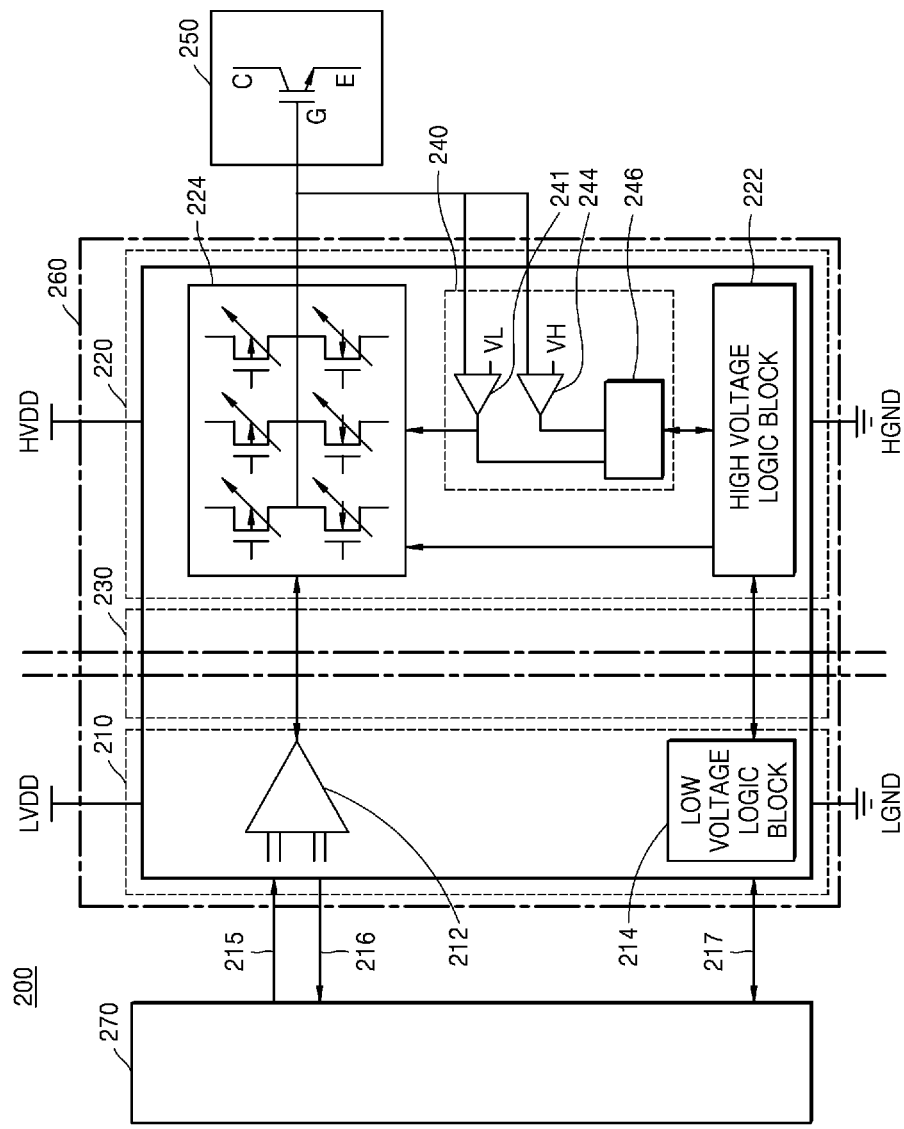
FIG. 2 is a circuit diagram illustrating a power device driving system including an isolated gate driver according to an embodiment of the present invention.

FIG. 2 is a diagram illustrating a power device driving system 200 according to an embodiment of the present invention. Referring to FIG. 2, a power device driving system 200 according to an embodiment of the present invention includes a power device 250, an isolated gate driver 260, and a microcontroller unit (MCU) 270.

The microcontroller unit 270 sends a PWM signal 215 to the isolated gate driver 260 to control the power device 250. A monitoring signal 216 for monitoring various sensing signals is received from the isolated gate driver 260 to the microcontroller unit 270 to check whether the transmitted PWM signal 215 operates the power device 250 properly. The monitoring signal 216 will be described in detail later.

In this case, the isolated gate driver 260 includes a low voltage part 210, a high voltage part 220, and an insulation part 230.

The low voltage part 210 includes a PWM transmission unit 212 for receiving a PWM signal from the microcontroller unit 270 and outputting a low voltage PWM signal having a low voltage, for example, an amplitude of 5V to the insulation part 230. And a low voltage logic block 214 receiving a control signal from the microcontroller unit 270 and outputting a low voltage control signal having a low voltage, for example, an amplitude of 5V to the insulation part 230.

The low voltage part 210 is typically operated by signals having 3V to 5V voltage. The low voltage logic block 214 receives control values for the slew rate controller 224 from the microcontroller unit 270 using a communication line 217. For example, the communication line 217 may include a serial peripheral interface (SPI) or an integrated circuit (I2C) and transmit the control values to the high voltage part 220 through the insulation part 230. Further, the low voltage logic block 214 may transmit various sensing data received from the high voltage logic block 222 to the microcontroller unit 270 again.

The insulation part 230 boosts low voltage PWM signal and the low voltage control signal into a high voltage PWM signals and a high voltage control signals having high voltage signals, while the insulation part 230 insulates the low voltage part 210 and the high voltage part 220. Further, the insulation part 230 converts the slew rate values provided by the high voltage logic block 222 into a low voltage signals and provides the low voltage signal to the low voltage logic block 214.

The high voltage part 220 includes the high voltage logic block 222 for outputting slew rate control signals for controlling the slew rate controller 224 based on the received high voltage control signal, the slew rate feedback unit 240 for measuring the slew rate value of the gate voltage of the power device 250 and providing the slew rate value to high voltage logic, and the slew rate controller 224 for converting the high voltage PWM signals into a slew rate-controlled PWM signal depending on the received slew rate control signals. Or the slew rate feedback unit 240 may measure the slew rate value of the gate voltage of the power device 250, generate a feedback signal based on the slew rate value and control the slew rate controller 224 based on the feedback signal.

In this case, the slew rate-controlled PWM signal converted by the slew rate controller 224 has a controlled slew rate on the rising edge and/or the falling edge depending on the slew rate control signals. The voltage of high voltage PWM signals typically ranges from 15V to 20V. The low voltage part 210, high voltage part 220, and the isolation part 230 are preferably implemented as a single chip.

The slew rate feedback unit 240 includes a low-voltage comparator 242, a high-voltage comparator 244, and a feedback performing unit 246. The low voltage comparator 242 compares the gate voltage of the power device 250 with the reference low voltage VL and outputs a low voltage comparison signal. The high voltage comparator 244 compares the gate voltage of the power device 250 with the reference high voltage VH and outputs a high voltage comparison signal.

Figure 6:
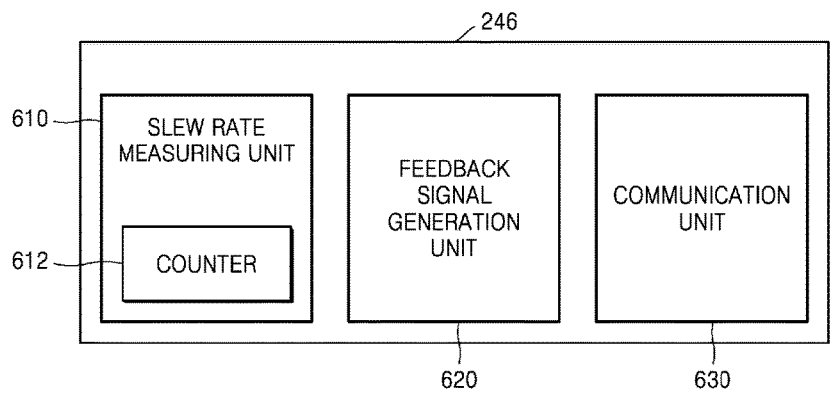
FIG. 6 shows an exemplary block diagram of a slew rate feedback section according to an embodiment of the present invention.

Referring to FIG. 6, the feedback performing unit 246 includes a slew rate measuring unit 610, a feedback signal generating unit 620, and a communication unit 630.

The slew rate measuring unit 610 measures the slew rate value based on the low voltage comparison signal and the high voltage comparison signal. The slew rate measuring unit 610 may include a counter 612 for measuring the required transition time for the gate voltage of the power device 250 to be changed from a low voltage to a high voltage or from a high voltage to a low voltage.

The feedback signal generating unit 620 may generate a feedback signal and output the feedback signal to the slew rate controller 224 when the generated slew rate value deviates from the reference slew rate range. The slew rate controller 224 can change the slew rate based on the feedback signal.

The communication unit 630 receives, from the high voltage logic block 222, a control signal indicating whether the feedback performing unit 246 generates a feedback signal in the feedback signal generating unit 620. Further, the communication unit 630 outputs the measured slew rate value to the high voltage logic block 222.

The feedback method of the slew rate feedback unit 240 will be described later in detail.

Hereinafter, the function of the slew rate controller 224 will be described in detail with reference to an example of the slew rate controller 224 of FIG. 3.

Figure 3:
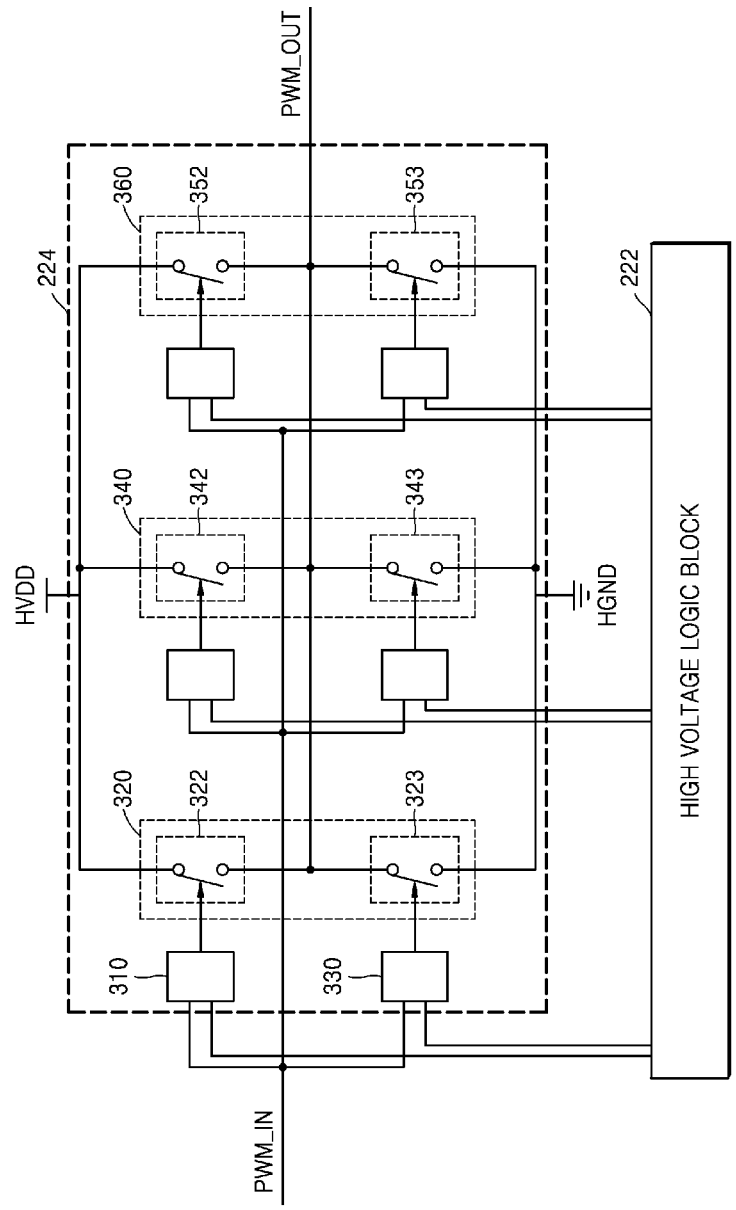
FIG. 3 is a detailed circuit diagram showing an example of the slew rate controller 224.

Referring to FIG. 3, the slew rate controller 224 may include an input portion PWM_IN, an output portion PWM_OUT, a plurality of buffers 320, 340 and 360, and a plurality of switch controllers 310 and 330. In this embodiment, the slew rate controller 224 including three buffers has been described as an example. However, it is possible to modify this embodiment to use the various number of buffers according to how many steps the slew rates are to be adjusted, that is, according to the required slew rate control resolution. For example, in this embodiment, it is possible to adjust the slew rate by eight steps of slopes by using three buffers.

The plurality of switch controllers 310 and 330 receive the slew rate control signals from the high voltage logic block 222 and/or the feedback signals from the slew rate feedback unit 240 and can control the plurality of switching units 322 and 323 based on the slew rate control signals, the feedback signals and the PWM signal.

Meanwhile, each buffer includes at least two switching units, a first switching unit 322 and a second switching unit 323.

The first switching unit 322 is connected to the output of the switch controller 310 and can be closed or opened under the control of the switch controller 310. For example, the first switching unit 322 is closed when the high voltage control signal and/or the feedback signal is at the high voltage ("1") and the voltage of the PWM signal is also at the high voltage. Or when at least one of the slew rate control signal, the feedback signal and the PWM signal is the low voltage, the first switching unit 322 is opened. In this case, when the first switching unit 322 is closed, it is preferable to control the second switching unit 323 to be opened. When the first switching unit 322 is closed, the power supply voltage HVDD of the high voltage unit 220 is applied to the output PWM_OUT of the slew rate controller 224 to supply a current to the gate of the power device 250.

In this case, the plurality of buffers includes at least a first buffer and a second buffer and the current flowing in the first switching unit of the first buffer is different from the magnitude of the current flowing in the first switching unit of the second buffer.

The second switching unit 323 is connected to the output of the switch controller 330 and can be closed or opened under the control of the switching control unit 330. For example, the second switching unit 323 can be closed when the high voltage control signal and/or the slew rate control signal is at the high voltage ("1") and the voltage of the PWM signal is at the low voltage ("0"). In other cases, the second switching unit 323 can be controlled to be opened. In this case, when the second switching unit 323 is closed, it is preferable to control the first switching unit 322 to be opened. When the second switching unit 323 is closed, the ground HGND of the high voltage part 220 is connected to the output PWM_OUT of the slope control unit 224 and currents get to flow to the ground HGND.

As the number of the closed switching units among the plurality of switching units 322, 342, and 352 connected to the power source HVDD of the high voltage part 220 increases, the supply of currents from the power source HVDD of the high voltage part 220 also increases and the voltage provided to the gate of the power device 250 rises rapidly at the rising edge of the gate signal (i.e., the slew rate of rising edge becomes larger). Conversely, as the number of the closed switching units among the plurality of switching units 323, 343, and 353 connected to the ground (HGND) of the high voltage part 220 increases, the flows of currents to the ground (HGND) of the high voltage part 220 from the gate of the power device 250 also increases so that the gate voltage is rapidly lowered at the falling edge of the PWM signal (that is, the slew rate at falling edge becomes larger).

Hereinafter, the effect of the slew rate control of the PWM signal of the present invention will be described with reference to FIGS. 2, 3, 7A and 7B.

Figure 7A:
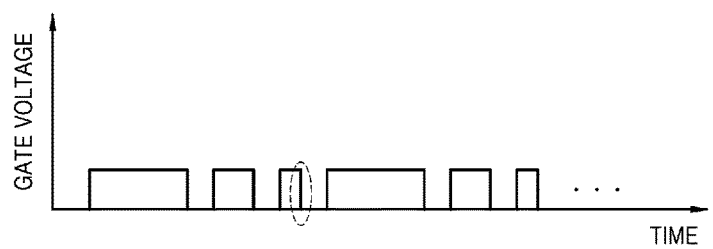
FIGS. 7A and 7B are diagrams for explaining the slew rate control of the present invention.

For explanation, it is assumed that a PWM signal like FIG. 7A is applied to the gate of the power device 250. In this case, FIG. 7B is an enlarged view for the falling edge portion of the PWM signal indicated by the dotted circle in FIG. 7A.

Figure 7B:
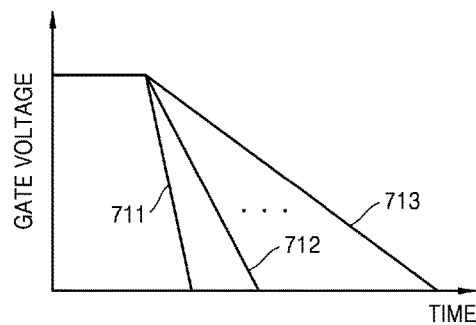

Referring to FIGS. 2, 3, and 7B, when all the second switching units 323, 343, and 353 of the buffers 320, 340, and 360 are closed (See line 711), the gate voltage of the PWM signal falls very rapidly. In the case where only the second switching unit 353 having the smallest current flowing amount among the second switching units 323, 343 and 353 of the buffers 320, 340 and 360 is closed, the gate voltage of the PWM signal falls very slowly (See line 713). That is, when the switches of all passages through which the current can flow are closed, the gate voltage drops quickly, and when the number of switches of the passages through which the current flows are reduced, the gate voltage drops slower. On the rising edge, the same principle can be applied to control the slew rate of the PWM signal of the gate voltage.

Since the gate voltage can fall very rapidly at the falling edge, the function of the active mirror clamp used for the rapid falling can be replaced by the slew rate controller 224 of the present invention.

In addition, the slew rate controller 224 of the present invention can also perform a soft turn-off function that reduces a slope of a gate voltage drop (turn-off) upon occurrence of an overcurrent or a short circuit. Further, it is also possible to set an appropriate slope regardless of external conditions or loads.

Figure 4A:
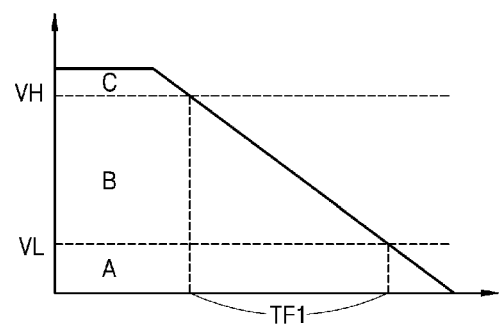
FIGS. 4A and 4B are views for explaining a slew rate measuring method according to an embodiment of the present invention.
Figure 4B:
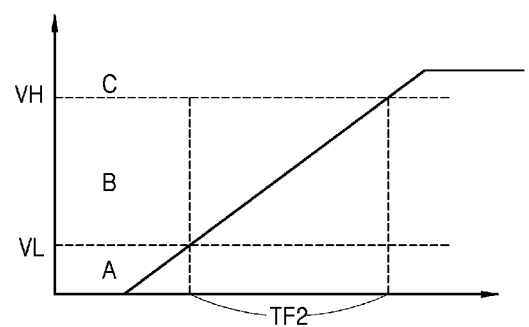

Hereinafter, a slew rate measuring method according to an embodiment of the present invention will be described with reference to FIGS. 4A and 4B. In FIGS. 4A and 4B, TF1 and TF2 represent falling times.

As described above, the slew rate feedback unit 240 includes a high-voltage comparator 244 and a low-voltage comparator 242. The high voltage comparator 244 compares the gate voltage of the power device 250 with the reference high voltage VH and outputs a high voltage comparison signal. The low voltage comparator 242 compares the gate voltage of the power device 250 with the reference low voltage VL and outputs a low voltage comparison signal. For simplicity of explanation, it is assumed that the low voltage comparator 242 and the high voltage comparator 244 output a high voltage ("1") when the gate voltage of the power device 250 is higher than the comparison voltage. However, those skilled in the art can also appropriately configure the output of the comparator.

To simplify the explanation, the region where the high voltage comparison signal and the low voltage comparison signal are high voltage ("1") is referred to C region (high voltage region). The region where the high voltage comparison signal is high voltage and the low voltage comparison signal is low voltage ("0") is referred to B region (transition region). And, the region where both the high voltage comparison signal and the low voltage comparison signal are low voltage is referred to A region (low voltage region).

As shown FIG. 4A, when the gate voltage of the power device 250 enters the region B from the C region (that is, at a moment when the voltage begins to fall from the high voltage region), the slew rate measurement unit 610 start to count a transition time. For example, the counting may be performed such that the counter 612 counts the number of clocks supplied to the slew rate measuring unit 610 during the transition time. This counting is terminated when the gate voltage of the power device 250 enters the A region from the B region. When the transition time TF1 from the start to the end of counting is measured, the slew rate can be calculated because the reference high voltage VH and the low voltage VL are already known.

As show FIG. 4B, when the gate voltage of the power device 250 enters the B region from the A region (that is, when the voltage starts to rise in the low voltage region), the counter 612 of the slew rate measuring unit 610 starts counting. For example, the counting may be performed such that the counter 612 counts the number of clocks supplied to the slew rate measuring unit 610 during the transition time. This counting is ended when the gate voltage of the power device 250 enters the C region from the B region (i.e., when the voltage enters the high voltage region). When the transition time TF2 from the start to the end of counting is measured, the slew rate can be calculated because the reference high voltage VH and the low voltage VL are already known.

Therefore, the slew rate measuring unit 610 can determine the slew rate by measuring the transition time from the high voltage region to the low voltage region or from the low voltage region to the high voltage region.

The measured slew rate value can be utilized in the following three ways.

First, the slew rate value is communicated to the high voltage logic block 222 by the communication unit 630, and the slew rate control signal is changed in the high voltage logic block 222 to control the slew rate controller 224. In this case, the communication unit 630 can output the counted time values between TF1 and TF2 to the high voltage logic block 222. Alternatively, the counted time values between TF1 and TF2 may be compared to a reference range and converted to a higher slew rate signal, a lower slew rate signal or hold signal (slew rate changing signal) and send them to the higher voltage logic block 222.

The high voltage logic block 222 may change the slew rate control signal according to the received slew rate value (for example, time value) or slew rate change signal, and may output a control signal to the slew rate controller 224.

The second method is outputting the slew rate value from the communication unit 630 to the high voltage logic block 222 and delivering the output slew rate slope value to the microcontroller unit 270 through the low voltage logic block 214. In this case, the microcontroller unit 270 can determine whether the slew rate is being accurately controlled. The microcontroller unit 270 can also control the slew rate controller 224 by sending a slew rate control signal to the high voltage logic block 222 via the low voltage logic 214 again.

Final method is that the slew rate feedback unit 240 itself performs feedback to the slew rate controller 224. In this case, the slew rate feedback unit 240 can check whether the slew rate is being accurately controlled in accordance with the slew rate control signal received by the high voltage logic 222. Further, when the slew rate is not precisely controlled, the slew rate change signal can be fed back to the slew rate controller 224.

Hereinafter, another embodiment of the present invention will be described with reference to FIG. 5. The power device driving system 200 according to FIG. 5 further includes a separate gate driver 420.

Figure 5:
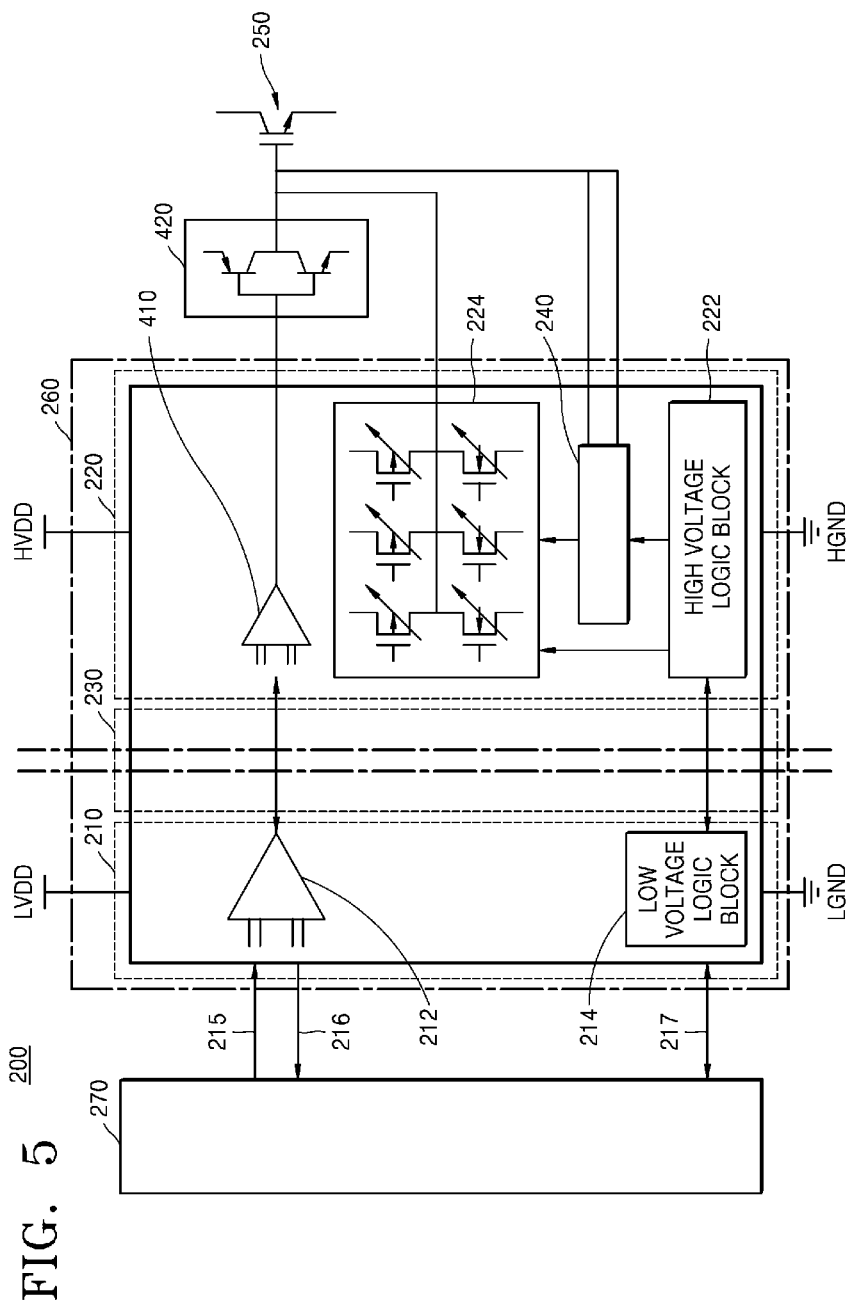
FIG. 5 is a circuit diagram showing a power device driving system according to another embodiment of the present invention.

Referring to FIG. 5, the isolated gate driver 260 includes a low voltage part 210, a high voltage part 220 and an insulation part 230. In this case, the high voltage part 220 includes a pre-driver 410 for driving a separate gate driver 420. The pre-driver 410 receives the voltage-boosted PWM signal through the insulation part 230 from the PWM signal 212.

The separate gate driver 420 outputs the gate driving voltage to the power device 250 by the PWM signal received from the pre-driver 410. The separate gate driver 420 is used when a larger current is required than the PWM signal supplied from the isolated gate driver 260 because a large current should be supplied to drive the power device 250.

The present invention automatically can control the slew rate of the gate drive voltage for stability of the power device and stability of the system when using the power device connected to the outside of the isolated gate driver. Conventionally, a fixed value of the slew rate was used for controlling the external power device, but according to the present invention, various slew rates can be automatically controlled internally and set depending on the operation state as well as to control the value internally. Since the slew rate applied to the gate of the power device 250 can be known accurately, accurate slew rate control is possible.

While the present invention has been described about what is presently considered to be practical exemplary embodiments, it is to be understood that the invention is not limited to the disclosed embodiments, but, on the contrary it is to be understood that the invention is not limited to the disclosed embodiments and intended to cover various modifications and similarities. Accordingly, the scope of the present invention should not be construed as being limited to the embodiments described, and it is to be interpreted that the scope of the present invention covers not only the claims of the following patent claims but also equivalents thereof.

What is claimed is:

1. An isolated gate driver comprising:
   a low voltage part including a PWM transmission unit for receiving a PWM signal from a microcontroller unit and outputting a low voltage PWM signal, and a low voltage logic block for receiving a control signal from the microcontroller unit and outputting a low voltage control signal;
   an insulation part for boosting the low voltage PWM signal and the low voltage control signal into a high voltage PWM signal and a high voltage control signal, respectively; and
   a high voltage part insulated from the low voltage part by the insulation part,
   wherein the high voltage part including:
   a high voltage logic block for outputting a slew rate control signal in accordance with the high voltage control signal;
   a slew rate controller for controlling a slew rate of a gate voltage of a power device external to the isolated gate driver such that the gate voltage of the power device has the slew rate depending on the slew rate control signal at a rising edge or a falling edge; and
   a slew rate feedback unit including a slew rate measuring unit for measuring the slew rate of the gate voltage and allowing the slew rate controller to change the slew rate of the gate voltage.

2. The isolated gate driver of claim 1, wherein the slew rate feedback unit further includes a feedback signal generating unit for generating a slew rate change signal when the slew rate of the gate voltage measured by the slew rate measuring unit is out of a reference range and for outputting the slew rate change signal to the slew rate controller, and
   wherein the slew rate controller changes the slew rate of the gate voltage based on the slew rate change signal.

3. The isolated gate driver of claim 1, wherein the slew rate feedback unit further includes a communication unit and outputs the slew rate value measured by the slew rate measuring unit to the high voltage logic block through the communication unit.

4. The isolated gate driver of claim 3, wherein the high voltage logic block is configured to control the slew rate controller to change the slew rate of the gate voltage based on the slew rate value.

5. The isolated gate driver of claim 1, wherein the slew rate feedback unit further includes a high voltage comparator and a low voltage comparator,
   wherein the high voltage comparator generates a high voltage comparison signal based on a reference high voltage, and
   wherein the low voltage comparator generates a low voltage comparison signal based on a reference low voltage and the slew rate measuring unit measures the slew rate of the gate voltage based on the high voltage comparison signal and the low voltage comparison signal.

6. The isolated gate driver of claim 5, wherein the slew rate measuring unit includes a counter,
   wherein the counter starts counting when the high voltage comparison signal is generated at the falling edge and terminates the counting when the low voltage comparison signal is generated after the falling edge.

7. The isolated gate driver of claim 5, wherein the slew rate measuring unit includes a counter,
   wherein the counter starts counting when the low voltage comparison signal is generated at the rising edge and terminates the counting when the high voltage comparison signal is generated after the rising edge.

8. The isolated gate driver of claim 1, wherein the slew rate controller includes a plurality of buffers each having first and second switching units switched by the slew rate control signal and the high voltage PWM signal.

9. The isolated gate driver of claim 8, wherein the plurality of buffers includes at least a first buffer and a second buffer and a magnitude of current flowing in the first switching unit of the first buffer is different from a magnitude of current flowing in the first switch portion of the second buffer.

10. A power device drive system comprising:
    a microcontroller unit;
    a power device; and an isolated gate driver configured to receive a PWM signal and a control signal from the microcontroller unit and configured so that the PWM signal applied to the gate of the power device has a controlled slew rate,
wherein the isolated gate driver comprises:
a low voltage part including a PWM transmission unit for receiving the PWM signal from the microcontroller unit and outputting a low voltage PWM signal, and a low voltage logic block for receiving a control signal from the microcontroller unit and outputting a low voltage control signal;
an insulation part for boosting the low voltage PWM signal and the low voltage control signal into a high voltage PWM signal and a high voltage control signal, respectively; and
a high voltage part insulated from the low voltage part by the insulation part,
wherein the high voltage part including:
a high voltage logic block for outputting a slew rate control signal in accordance with the high voltage control signal;
a slew rate controller for controlling a slew rate of a gate voltage of a power device external to the isolated gate driver such that the gate voltage of the power device has the slew rate depending on the slew rate control signal at a rising edge or a falling edge; and
a slew rate feedback unit including a slew rate measuring unit for measuring the slew rate of the gate voltage and allowing the slew rate controller to change the slew rate of the gate voltage.

11. The power device drive system of claim 10, wherein the slew rate feedback unit further includes a feedback signal generating unit for generating a slew rate change signal when the slew rate of the gate measured by the slew rate measuring unit is out of a reference range and for outputting the slew rate change signal to the slew rate controller, and wherein the slew rate controller changes the slew rate of the gate based on the slew rate change signal.

12. The power device drive system of claim 10, wherein the slew rate feedback unit further includes a communication unit and outputs the slew rate value measured by the slew rate measuring unit to the high voltage logic block through the communication unit.

13. The power device drive system of claim 12, wherein the high voltage logic block is configured to control the slew rate controller to change the slew rate of the gate based on the slew rate value.

14. The power device drive system of claim 12, wherein the high voltage logic block sends the slew rate value to the microcontroller unit through the low voltage logic block, and wherein the microcontroller unit check whether the slew rate value is in a reference slew rate range and generates a control signal for controlling the slew rate controller.

* * * * *